United States Patent
Kobayashi et al.

[11] Patent Number: 6,104,183
[45] Date of Patent: *Aug. 15, 2000

[54] SEMICONDUCTOR DEVICE TESTING APPARATUS

[75] Inventors: Yoshihito Kobayashi, Gyoda; Tsuyoshi Yamashita, Gunma; Hiroto Nakamura, Kazo; Shin Nemoto, Yono; Yoshiyuki Masuo, Gyoda; Akihiko Ito, Hanyu, all of Japan

[73] Assignee: Advantest Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/809,243
[22] PCT Filed: Jul. 24, 1996
[86] PCT No.: PCT/JP96/02067
  § 371 Date: May 28, 1997
  § 102(e) Date: May 28, 1997
[87] PCT Pub. No.: WO97/05495
  PCT Pub. Date: Feb. 13, 1997

[30] Foreign Application Priority Data

Jul. 26, 1995 [JP] Japan .................................. 7-190855

[51] Int. Cl.[7] .................................................. G01R 31/28
[52] U.S. Cl. ........................................ 324/158.1; 324/765
[58] Field of Search ................................. 324/158.1, 755, 324/765, 754, 73.1; 414/416, 422, 783; 209/573

[56] References Cited

U.S. PATENT DOCUMENTS

| | | | |
|---|---|---|---|
| 4,103,232 | 7/1978 | Sugita et al. | 324/754 |
| 5,150,797 | 9/1992 | Shibata | 209/573 |
| 5,184,068 | 2/1993 | Twigg et al. | |
| 5,313,156 | 5/1994 | Klug et al. | 324/158.1 |

*Primary Examiner*—Vinh P. Nguyen
*Attorney, Agent, or Firm*—Staas & Halsey LLP

[57] ABSTRACT

A semiconductor device testing apparatus having a reduced transverse width and compact in size is provided. Adjacent to a constant temperature chamber 101 containing therein a vertical transport means is located a test chamber 102 which is in turn adjoined by a temperature-stress removing chamber 103 likewise containing therein a vertical transport means, so that the constant temperature chamber 101, the test chamber 102 and the temperature-stress removing chamber 103 are arranged transversely in a line. Further, a loader section 300 is located in front of the constant temperature chamber, and an unloader section 400 is located in front of the test chamber and the temperature-stress removing chamber. With this arrangement, the transverse width of the testing apparatus may be reduced to about three test tray lengths.

21 Claims, 9 Drawing Sheets

SEMICONDUCTOR DEVICE TESTING APPARATUS

BACKGROUND OF THE INVENTION

1. Field of the Invention

The present invention relates to a semiconductor device testing apparatus suitable for testing one or more semiconductor devices, particularly one or more semiconductor integrated circuit elements (as will be referred to as IC or ICs hereinafter) which are typical examples of the semiconductor devices. More particularly, the present invention relates to a semiconductor device testing apparatus of the type in which ICs to be tested are transported, for testing, to a test or testing section where they are brought into electrical contact with a tester head (a component of the testing apparatus for applying and receiving various electrical signals for testing), followed by being carried out of the testing section and then being sorted out into conformable or pass articles and unconformable or failure articles on the basis of the test results.

2. Background of the Related Art

Many of the semiconductor device testing apparatuses (commonly called IC testers) for applying a test signal of a predetermined pattern to a semiconductor device to be tested, i.e. device under test (commonly called DUT) and measuring the electrical characteristics of the devices, have a semiconductor device transporting and handling or processing apparatus (commonly called handler) mounted or connected thereto. The handler which transports semiconductor devices to a testing section, brings them into electrical contact with a tester head in the testing section, and, after the testing, carries the tested semiconductor devices out of the testing section, and sorts them out into pass articles and failure articles on the basis of the test results. In the specification, the testing apparatus which comprises a combination of the IC tester and the IC handler connected thereto or integrally mounted thereto of the type described above is termed "semiconductor device testing apparatus". In the following disclosure the present invention will be described by taking ICs typical of semiconductor devices for example for clarity of explanation.

A description will be given first regarding the general construction of a conventional IC testing apparatus with reference to FIGS. 4 and 5. FIG. 4 is a plan view of the IC testing apparatus schematically showing, in perspective, a chamber section 100. In addition to the chamber section 100, the illustrated IC testing apparatus further comprises an IC storage section 200 where ICs that will undergo a test (i.e., ICs to be tested) are stored and the tested ICs are sorted and stored in place, a loader section 300 where ICs to be tested which a user has beforehand loaded on a general-purpose tray (customer tray) KST are transferred and reloaded onto a test tray TST capable of withstanding high/low temperatures, and an unloader section 400 where the tested ICs which have been carried on the test tray TST out of the chamber section 100 subsequently to undergoing a test in the testing chamber 100 are transferred from the test tray TST to one or more general-purpose trays KST to be reloaded on the latter. The unloader section 400 is generally constructed to sort the tested ICs on the basis of the test results and load them on the corresponding general-purpose trays.

The chamber section 100 comprises a constant temperature or thermostatic chamber 101 for receiving the ICs to be tested loaded on the test tray TST and imposing an intended high or low temperature stress to the ICs, a test or testing chamber 102 for effecting an electrical test on the ICs subjected to the temperature stress in the constant temperature chamber 101, and a temperature-stress removing chamber 103 for removing the temperature stress of the ICs having been applied thereto in the test chamber 102 from the ICs. The test chamber 102 contains therein a tester head 104 of the testing apparatus, supplies various electric signals for testing via the tester head 104 to the ICs to be tested in electrically contact therewith, receives response signals from the ICs, and sends them to the testing apparatus.

Each of the test trays TST is moved in a circulating manner from the loader section 300 through the constant temperature chamber 101 of the chamber section 100, the test chamber 102 of the chamber section 100, the temperature-stress removing chamber 103 of the chamber 100, and the unloader section 400 in this order, to the loader section 300. The constant temperature chamber 101 and the temperature-stress removing chamber 103 are taller than the test chamber 102, and have upward portions protruding beyond the top of the test chamber 102, respectively. As shown in FIG. 5, a base plate 105 spans between the upward protruding portions of the constant temperature chamber 101 and the temperature-stress removing chamber 103, and a test tray conveying means 108 is mounted on the base plate 105 to transport the test tray TST from the temperature-stress removing chamber 103 to the constant temperature chamber 101.

In case the ICs to be tested have been heated to a high temperature (in this example, a thermal stress is applied to the ICs) in the constant temperature chamber 101, the temperature-stress removing chamber 103 cools the tested ICs down to room temperature by blowing, after which they are transported to the unloader section 400. On the other hand, in case the ICs to be tested have been cooled down or freezed to, for instance, −30° C. (in this example, a cryogenic stress is applied to the ICs) in the constant temperature chamber 101, the temperature-stress removing chamber 103 heats the tested ICs by warm air or a heater up to a temperature at which the ICs have no dew condensation, and then they are removed from the temperature-stress removing chamber 103 to the unloader section 400.

The test tray TST with the ICs loaded thereon in the loader section 300 is conveyed from the loader section to the constant temperature chamber 101 within the chamber section 100. The constant temperature chamber 101 has a vertical conveyor means mounted therein which is adapted to support a plurality of (nine, for instance) test trays TST in the form of a stack. In the illustrated example, the vertical conveyor means stacks the transported test trays such that a test tray newly received from the loader section 300 is supported at the uppermost of the stack while the bottom test tray is delivered to the test chamber 102. The ICs to be tested on the uppermost test tray TST are given a predetermined high or low temperature stress while the associated test tray TST is moved sequentially from the top to the bottom of the stack by vertically downward movement of the vertical conveyor means and/or waits until the immediately preceding test tray is brought out of the test chamber 102. The tester head 104 is disposed in the test chamber 102 at the central area thereof, and each of the test trays TST carried out one by one from the constant temperature chamber 101 is conveyed onto the tester head 104 while being maintained at the constant temperature, and a predetermined number of the ICs among the ICs on the associated test tray TST are electrically connected to IC sockets (not shown) mounted on the tester head 104, as will be discussed hereinbelow. Upon completion of the test on all of the ICs placed on one test tray TST through the tester head 104, the test tray TST is transported to the temperature-stress removing chamber 103 where the tested ICs on the associated test tray are relieved of heat to be restored to the ambient or room temperature, and thereafter the test tray TST is discharged to the unloader section 400.

Like the constant temperature chamber 101 as described above, the temperature-stress removing chamber 103 is also equipped with a vertical conveyor means adapted to support a plurality of (nine, for instance) test trays TST stacked one on another. In the illustrated example, the test tray TST newly received from the test chamber 102 is supported at the bottom of the stack while the uppermost test tray is discharged to the unloader section 400. The tested ICs on the associated test tray are relieved of heat to be restored to the outside temperature (room temperature) as the associated test tray TST is moved from the bottom to the top of the stack by vertically upward movement of the vertical conveyor means.

The tested ICs as carried on the test tray TST are passed to the unloader section 400 where they are sorted out by categories based on the test results and transferred from the test tray TST onto and stored in the corresponding general-purpose trays for respective categories. The test tray TST thus emptied in the unloader section 400 is transported to the loader section 300 where it is again loaded with ICs to be tested from a general-purpose tray KST onto the test tray TST, after which the same steps of above-described operation are repeated.

As shown in FIG. 5, an IC transfer means for transferring ICs from a general-purpose tray KST to a test tray TST in the loader section 300 may be in the form of X and Y direction transfer means 304 which comprises a pair of spaced parallel rails 301 mounted on the base plate 105 and extending over the loader section 400 in the front-to-back or forward-rearward direction of the testing apparatus (referred to as the Y direction herein), a movable arm 302 which spans between the two rails 301 and has its opposite ends secured thereto in a manner to be movable in the Y direction, and a movable head 303 which is supported by the movable arm 302 in a manner to be movable in the direction in which the movable arm 302 extends, that is. in the left to right direction of the testing apparatus (referred to as the X direction herein). With this arrangement, the movable head 303 is allowed to reciprocate between the test tray TST and the general-purpose tray KST in the Y direction and move along the movable arm 302 in the X direction.

On the underside of the movable head 303 are vertically movably mounted IC suction pads. Through the movement of the movable head 303 in the X and Y directions and the downward movement of the suction pads in combination, the suction pads are brought into abutment with the ICs placed on the general-purpose tray KST and pick them up and hold thereto by vacuum suction to transfer them to the test tray TST. The number of suction pads that are mounted on the movable head 303 may be eight, for instance, so that a total of eight ICs may be transferred from the general-purpose tray KST to the test tray TST at one time.

It is to be noted here that means 305 for correcting the position of an IC called "preciser" (FIG. 5) is located between stopping positions for the general-purpose tray KST and the test tray TST. The position correcting means 305 includes relatively deep recesses into which the ICs as being attracted against the suction pads are once released to fall prior to being transferred to the test tray TST. The recesses are each defined by vertical tapered side walls which prescribe for the positions at which the ICs drop into the recesses by virtue of the tapering. After eight ICs have been precisely positioned relative to each other by the position correcting means 305, those eight ICs accurately positioned are again attracted against the suction pads and conveyed to the test tray TST. The reason that the position correcting means 305 is provided is as follows. Recesses of the general-purpose tray TST for holding the ICs are sized larger as compared to the size of ICs, resulting in wide variations in positions of ICs placed on the general-purpose tray KST. Consequently, if the ICs as such were vacuum picked up by the suction pads and transferred directly to the test tray TST, there might be some of the ICs which could not be successfully deposited into the IC storage recesses formed in the test tray TST. This is the reason for requiring the position correcting means 305, as described above which acts to array ICs as accurately as the array of the IC storage recesses formed in the test tray TST.

The unloader section 400 is equipped with two sets of X and Y direction transfer means 404 which are identical in construction to the X and Y direction transfer means 304 provided for the loader section 300. The X and Y direction transfer means 404 performs to transship the tested ICs from the test tray TST delivered out to the unloader section 400 onto the general-purpose tray KST. Each set of the X and Y direction transfer means 404 comprises a pair of spaced parallel rails 401 mounted to extend in the forward-rearward direction of the testing apparatus (Y direction), a movable arm 402 spanning between the pair of rails 401 and movably mounted at opposite ends on the pair of rails 401 in the Y direction, and a movable head 403 mounted on the movable arm 402 for movement therealong longitudinally of the arm, that is, in the right to left direction of the testing apparatus (X direction).

FIG. 6 shows the construction of one example of the test tray TST. The illustrated test tray TST comprises a rectangular frame 12 having a plurality of equally spaced apart parallel cleats 13 between the opposed side frame members 12a and 12b of the frame, each of the cleats 13 having a plurality of equally spaced apart mounting lugs 14 protruding therefrom on both sides thereof and each of the side frame members 12a, 12b opposing the adjacent cleats having similar mounting lugs 14 protruding therefrom. The mounting lugs 14 protruding from the opposed sides of each of the cleats 13 are arranged such that each of the mounting lugs 14 protruding from one side of the cleat 13 is positioned intermediate two adjacent mounting lugs 14 protruding from thy opposite side of the cleat. Similarly, each of the mounting lugs 14 protruding from each of the side frame members 12a and 12b is positioned intermediate two adjacent mounting lugs 14 protruding from the opposed cleat. Formed between each pair of opposed cleats 13 and between each of the side frame members 12a and 12b and the opposed cleats are spaces for accommodating a multiplicity of IC carriers 16 in juxtaposition. More specifically, each IC carrier 16 is accommodated in one of an array of rectangular carrier compartments 15 defined in each of said spaces, each compartment 15 including two staggered, obliquely opposed mounting lugs 14 located at the diagonally opposed corners of the compartment. In the illustrated example wherein each cleat 13 has sixteen mounting lugs 14 on either side thereof, there are sixteen carrier compartments 15 formed in each of the cleats, in which sixteen IC carriers 16 are mounted. Since there are four of the spaces, 16×4, that is, 64 IC carriers in total can be mounted in one test tray TST. Each IC carrier 16 is placed on corresponding two mounting lugs 14 and fixed thereto by fasteners 17.

Each of IC carriers 16 is of identical shape and size in its outer contour and has an IC pocket 19 in the center for accommodating an IC element therein. The shape and size of the IC pocket 19 is determined depending on those of the IC element 18 to be accommodated therein. In the illustrated example, the IC pocket 19 is in the shape of a generally square recess. The outer dimensions of the IC pocket 19 are sized so as to be loosely fitted in the space defined between the opposed mounting lugs 14 in the carrier compartment 15. The IC carrier 16 has flanges at its opposed ends adapted to rest on the corresponding mounting lugs 14, these flanges having mounting holes 21 and holes 22 formed therethrough, respectively, the mounting holes 21 being adapted to receive fasteners 17 therethrough and the holes 22 being adapted to pass locating pins therethrough.

In order to prevent IC elements from slipping out of place within the IC carrier 16 or jumping out of the IC carrier 16, a pair of latches 23 are attached to the IC carrier 16, as shown in FIG. 7. These latches 23 are integrally formed with the body of the IC carrier so as to extend upwardly from the base of the IC pocket 19, and are normally resiliently biased such that the top end pawls are urged toward each other by virtue of the resiliency of the resin material of which the IC carrier is made. When the IC element is to be deposited into or removed from the IC pocket 19, the top ends of the two latches 23 are expanded away from each other by a latch releasing mechanism 25 disposed on opposite sides of an IC suction pad 24 for picking up an IC element prior to effectuating the deposition of the IC element into or removal from the IC pocket 19. Upon the latch releasing mechanism 25 being moved out of engagement with the latches 23, the latches 23 will snap back to their normal positions by their resilient forces where the deposited IC is held in place against dislodgement by the top end pawls of the latches 23.

The IC carrier 16 holds an IC element in place with its leads or pins 18 exposed downwardly as shown in FIG. 8. The tester head 104 has an IC socket mounted thereto, and contacts 31 of the IC socket upwardly extend from the top surface of the tester head 104. The exposed leads 18 of the IC element are pushed against the contacts 31 of the IC socket to establish electrical connection between the IC element and the socket. To this end, a pusher 30 for pushing and holding an IC element down is mounted above the tester head 104 and is configured to push the IC element accommodated in an IC carrier 16 from above into contact with the tester head 104.

The number of IC elements which may be connected with the tester head 104 at a time depends on the number of IC sockets mounted on the tester head 104. By way of example, where sixty-four IC elements are arranged in an array of 4 lines×16 rows on a test tray TST as shown in FIG. 9, 4×4, that is, 16 IC sockets are arranged and mounted on the tester head 104 such that the IC elements (shown as obliquely hatched) in every fourth row in each of the lines may be tested all at one time. More specifically, in the first test run the examination is conducted on sixteen IC elements located in the first, fifth, ninth and thirteenth rows in each line, the second test run is effected on another sixteen IC elements located in the second, sixth, tenth and fourteenth rows in each line by shifting the test tray TST by a distance corresponding to one row of IC elements, and the third and fourth test runs are carried out in the similar manner until all of the IC elements are tested. The test results are stored in a memory at the addresses determined by, for instance, the identification number affixed to the test tray TST and the IC numbers assigned to the IC elements contained in the test tray. It is to be appreciated that where thirty-two IC sockets may be mounted on the tester head 104, only two test runs are required to examine all sixty-four IC elements arranged in an array of 4 lines×16 rows. It is also to be noted that there is another type of IC handler in which ICs to be tested are transferred from the test tray into a socket mounted on the tester head 104 and upon the test being completed the tested ICs are transferred from the socket back onto the test tray to transport the ICs, in the test chamber 102.

The IC storage section 200 comprises an IC storage rack (or stocker) 201 for accommodating general-purpose trays KST loaded with ICs to be tested and a tested IC storage rack (or stocker) 202 for accommodating general-purpose trays KST loaded with tested ICs sorted out by categories on the basis of the test results. The IC storage rack 201 and tested IC storage rack 202 are configured to accommodate general-purpose trays in the form of a stack. The general-purpose trays KST with ICs to be tested carried thereon and stored in the form of a stack in the IC storage rack 201 are transported successively from the top of the stack to the loader section 300 where the ICs to be tested (DUTs) are transferred from the general-purpose tray KST onto a test tray TST on standby in the loader section 300.

Either of the IC storage rack 201 and any one of the tested IC storage racks 202 comprises, as any one of the IC storage rack 201 and the tested IC storage racks 202 is shown in FIG. 10, a tray supporting frame 203 open at the top and having an opening at the bottom, and an elevator 204 disposed below the frame 203 so as to be vertically movable through the bottom opening. In the tray supporting frame 203 there are stored and supported a plurality of general-purpose trays KST stacked one on another which are vertically moved by the elevator 204 acting through the bottom opening of the frame 203.

In the example illustrated in FIGS. 4 and 5, eight racks STK-1, STK-2, . . . , STK-8 are provided as tested IC storage racks 202 so as to be able to store tested ICs which may be sorted out into eight categories at a maximum according to the test results. This is because in some applications tested ICs may not only be classified into categories of "conformable or pass article" and "unconformable or failure article" but also be subclassified into those having high, medium and low operation speeds among the "pass" articles and those required to be retested among the "failure" articles, and others. Even if the number of classifiable categories is up to eight, the unloader section 400 in the illustrated example is capable of accommodating only four general-purpose trays KST. For this reason, if there occur some among the tested ICs which should be classified into a category other than categories assigned to the general-purpose trays KST arranged in the unloader section 400, the procedures taken are to return one of the general-purpose trays KST from the unloader section 400 to the IC storage section 200 and in replacement to transfer a general-purpose tray KST for storing the ICs belonging to the new additional category from the IC storage section 200 to the unloader section 400 where those ICs are stored in the new tray.

Referring to FIG. 5, a tray transfer means 205 is disposed above the IC storage rack 201 and the tested IC storage racks 202 for movement over the entire extent of the storage racks 201 and 202 in the direction of arrangement of the racks (in the right to left direction of the testing apparatus) relative to the base plate 105. The tray transfer means 205 is provided on its bottom with grasp means for grasping a general-purpose tray KST. The tray transfer means 205 is moved to a position over the IC storage rack 201 whereupon the elevator 204 is actuated to lift the general-purpose trays KST stacked in the IC storage rack 201, so that the uppermost general-purpose tray KST may be picked up by the grasp means of the tray transfer means 205. Once the uppermost general-purpose tray KST loaded with ICs to be tested has been transferred to the tray transfer means 205, the elevator 204 is lowered to its original position. The tray transfer means 205 is then horizontally moved to and stopped at a predetermined position in the loader section 300 where the grasp means of the tray transfer means 205 is released to allow the general-purpose tray KST to drop into an immediately underlying tray receiver (not shown). The tray transfer means 205 from which the general-purpose tray KST has been unloaded is moved out of the loader section 300. Then, the elevator 204 is moved upward from below the tray receiver having the general-purpose tray KST deposited thereon to lift up the tray receiver and hence the general-purpose tray KST loaded with ICs to be tested so that the general-purpose tray KST is kept exposed up through a window 106 formed in the base plate 105.

The base plate 105 is formed in the area overlying the unloader section 400 with another two similar windows 106 through which empty general-purpose trays are kept exposed. In this example, each of the windows 106 is sized to expose two general-purpose trays therethrough. Hence, four empty general-purpose trays are kept exposed up through two windows 106. Tested ICs are sorted out and stored in these empty general-purpose trays KST according to the categories assigned to respective trays. As with the loader section 300, the four empty general-purpose trays KST are placed on the respective tray receivers which are moved up and down by the associated elevators 204. Once one general-purpose tray KST has been fully filled, the tray is lowered from the level of the window 16 by the elevator 204 and stored in the tray storage position assigned to said tray by the tray transfer means 205. Indicated by the numeral 206 in FIGS. 4 and 5 is an empty tray storage rack for accommodating empty general-purpose trays KST. From this empty tray storage rack 206, empty general-purpose trays are transported to the respective windows 106 by the tray transfer means 205 and the elevators 204 and held thereat by the associated elevators 204 to be ready for receiving tested ICs.

The construction and operation as described above of the conventional IC testing apparatus requires that the loader and the unloader sections 300 and 400 be arranged in a serial or tandem fashion between the constant temperature chamber 101 and the temperature-stress removing chamber 103, resulting undesirably in an increase in the transverse width W of the testing apparatus as measured in the right-left direction (FIG. 5), actually the transverse width W of the handler portion.

As diagrammatically shown in FIG. 11, however, it is often customary to incorporate two handler portions HM1 (principally the upper mechanical portion in FIG. 5) and HM2 with respect to the single electrical portion, that is, the IC tester portion TES (principally the lower electrical portion in FIG. 5) of the IC testing apparatus for measuring the electrical characteristics of ICs under test by applying test signals of a predetermined pattern to the ICs so that the combination of the two handler portions and the single IC tester portion may be operated as one IC tester apparatus. Consequently, if each of the handler portions is oversized in its transverse width $W_1$, two handler portions HM1 and HM2 cannot be installed within the extent of the transverse width $W_2$ of the IC tester portion TES, but protrude substantially beyond the transverse width $W_2$ of the IC tester portion TES. As a result, where numerous IC testing apparatuses are installed, there would be much waste in the floor space and the number of IC testing apparatus that can be installed would be significantly limited.

SUMMARY OF THE INVENTION

It is an object of the present invention to provide an IC testing apparatus configured to allow for reducing the transverse width of the handler portion to thereby narrow the space needed for installing two handler portions.

According to a first aspect of the present invention, an IC testing apparatus is provided in which a test tray loaded with ICs to be tested in a loader section is subjected to testing as the test tray is moved from the loader section sequentially through a constant temperature chamber, a test chamber and a temperature-stress removing chamber, and which is characterized in that the loader section is located in front of the constant temperature chamber and that two of the unloader sections are located in front of the test chamber and the temperature-stress removing chamber.

According to a second aspect of the present invention, an IC testing apparatus is provided in which a test tray loaded with ICs to be tested in a loader section is subjected to testing as the test tray is moved from the loader section sequentially through a constant temperature chamber, a test chamber and a temperature-stress removing chamber, and which is characterized in that the loader section is located in front of the constant temperature chamber, that the heat removing chamber is located in front of the test chamber, and that the unloader section is located over the heat removing chamber.

With the construction of the IC testing apparatus according to the first aspect, the constant temperature chamber, the test chamber and the temperature-stress removing chamber are arranged transversely in side-by-side relation, so that the entire length of this arrangement determines the transverse width of the handler portion. As a result, assuming that each of the constant temperature chamber, the test chamber and the temperature-stress removing chamber is adapted to hold one test tray, it is possible to reduce the transverse width of one handler portion to the transverse width corresponding to about three test tray lengths (major dimensions or dimensions transverse of the testing apparatus). Consequently, the transverse width of the handler portion may be decreased by one test tray length as compared with the conventional testing apparatus having one unloader section incorporated therein.

With the construction of the IC testing apparatus according to the second aspect, it is only the constant temperature chamber and the test chamber that are arranged transversely in side-by-side relation, and the temperature-stress removing chamber is located in front of the test chamber and the unloader section is disposed over the temperature-stress removing chamber and the loader section is located in front of the constant temperature chamber. Assuming that each of the constant temperature chamber and the test chamber is adapted to hold one test tray, it only requires about two test tray lengths to accommodate the transverse width of the handler portion. Hence, this embodiment provides the advantage that the transverse width of the handler portion may be further decreased by one test tray length as compared with the testing apparatus according to the first aspect of the invention.

According to a third aspect of the present invention, an IC testing apparatus is provided in which a test tray loaded with ICs to be tested in a loader section is subjected to testing as the test tray is moved from the loader section sequentially through a constant temperature chamber, a test chamber and a temperature-stress removing chamber, and which is characterized in that both the constant temperature chamber and the temperature-stress removing chamber have respective tray inlets and outlets provided in their orthogonally intersecting side faces such that the test tray is introduced into the constant temperature chamber through the front side face and discharged therefrom through the inner lateral side face into the adjoining test chamber from where it is passed into the temperature-stress removing chamber through the inner lateral side race thereof and discharged therefrom through the front side face thereof facing orthogonally with respect to the direction of passage into the temperature-stress removing chamber (transverse direction), whereby the loader section may be located in front of the constant temperature chamber and the unloader section may be located in front of the temperature-stress removing chamber.

According to a fourth aspect of the present invention, an IC testing apparatus is provided in which a test tray loaded with ICs to be tested in a loader section is subjected to testing as the test tray is moved from the loader section sequentially through a constant temperature chamber, a test chamber and a temperature-stress removing chamber, and which is characterized in that two unloader sections are located in front of both the test chamber and the temperature-stress removing chamber, and that a common X and Y direction transfer means is disposed spanning the two unloader sections so that tested ICs carried on the two test trays delivered to the two unloader sections respectively may be sorted out on the basis of the test results and transferred onto general-purpose trays by the common X and Y direction transfer means.

According to a fifth aspect of the present invention, in the IC testing apparatus according to the fourth aspect, the arrangement is made such that the sorting operation is performed with respect to only general-purpose trays arranged adjacent to each of the unloader sections when the tested ICs are taken from the two unloader sections and transferred onto the general-purpose trays.

With the construction of the IC testing apparatus according to the fourth and fifth aspects, since the X and Y direction transfer means is used in common with the two unloader sections, the construction is simplified, resulting in reduction of cost. In addition, with the IC testing apparatus according to the fifth aspect, since the sorting operation is carried out with respect to only the general-purpose trays arranged adjacent to each of the unloader sections, the sorting speed is increased, resulting in speeding up the entire testing process.

Further, according to a sixth aspect of this invention, an IC testing apparatus is provided in which a test tray loaded with ICs to be tested in a loader section is subjected to testing as the test tray is moved from the loader section sequentially through a constant temperature chamber, a test chamber and a temperature-stress removing chamber, and which is characterized in that a buffer section for temporarily keeping tested ICs sorted out on the basis of the test results is disposed between test trays delivered out to the unloader sections and general-purpose trays positioned adjacent to the unloader sections.

With the construction of the IC testing apparatus according to the sixth aspect, the buffer section disposed in the unloader section provides means for temporarily keeping tested ICs even if the unloader section happens to lack a particular general-purpose tray assigned to a particular classification category into which some of tested ICs taken out of the test tray are to be sorted out. This allows for changing the general-purpose trays without interrupting the sorting operation, whereby enhancement of the processing speed is expected.

BEST MODES FOR CARRYING OUT THE INVENTION

Figure 1:
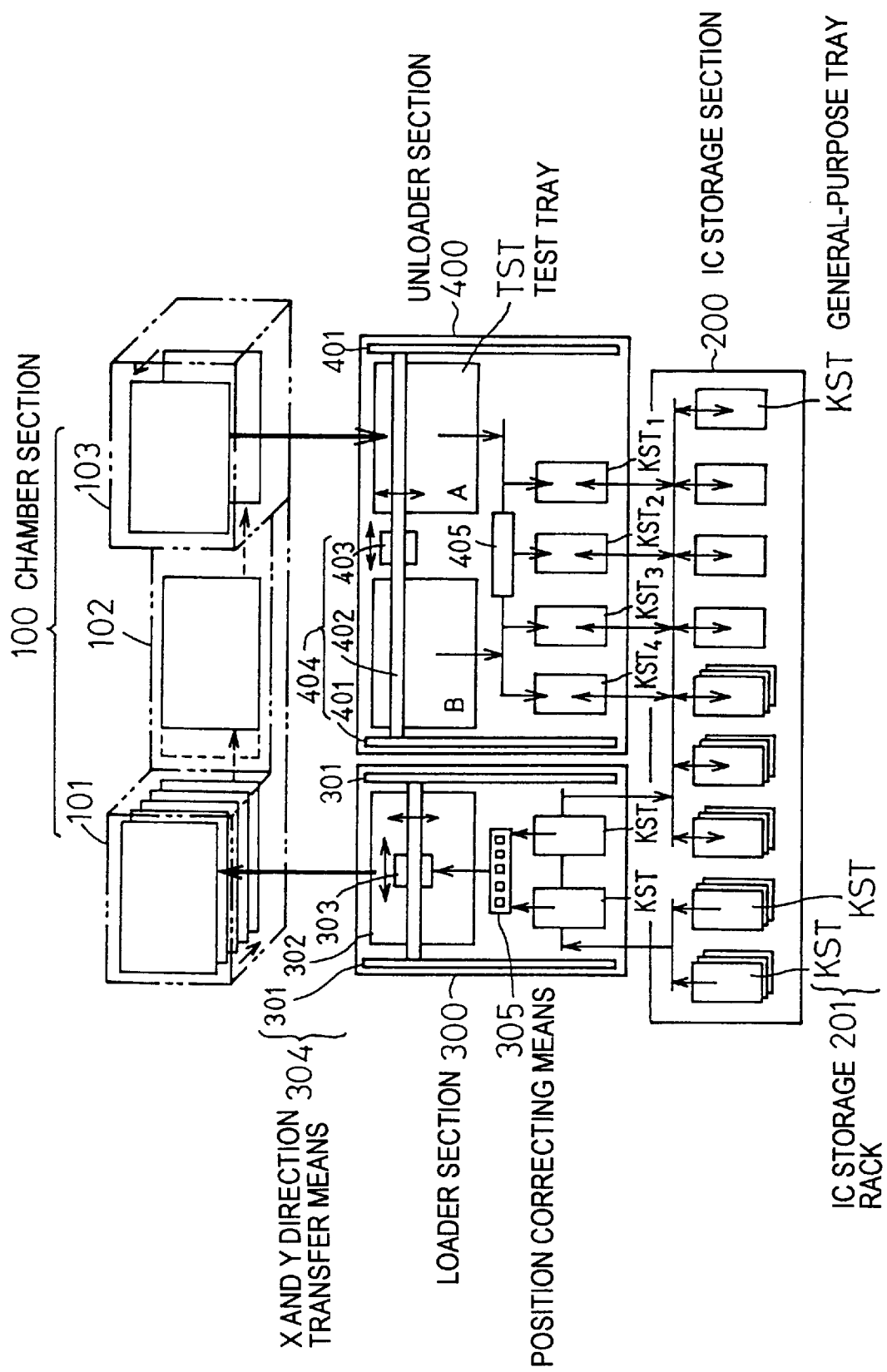
FIG. 1 is a plan view schematically illustrating a first embodiment of the IC testing apparatus according to the present invention, with the chamber section shown in a perspective-like view.
Figure 4:
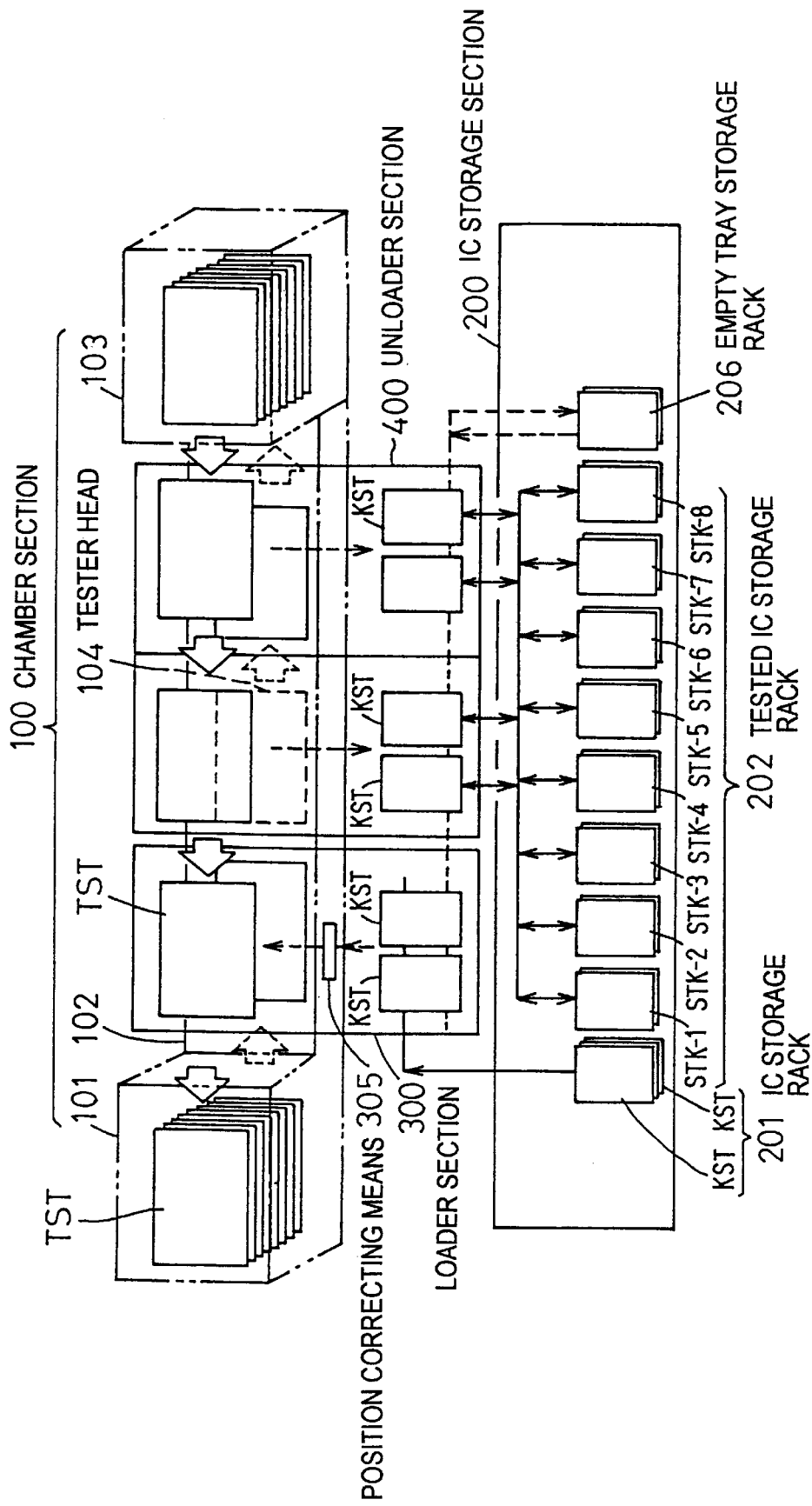
FIG. 4 is a plan view schematically showing an example of the conventional IC testing apparatus, with the chamber section shown in a perspective-like view.
Figure 5:
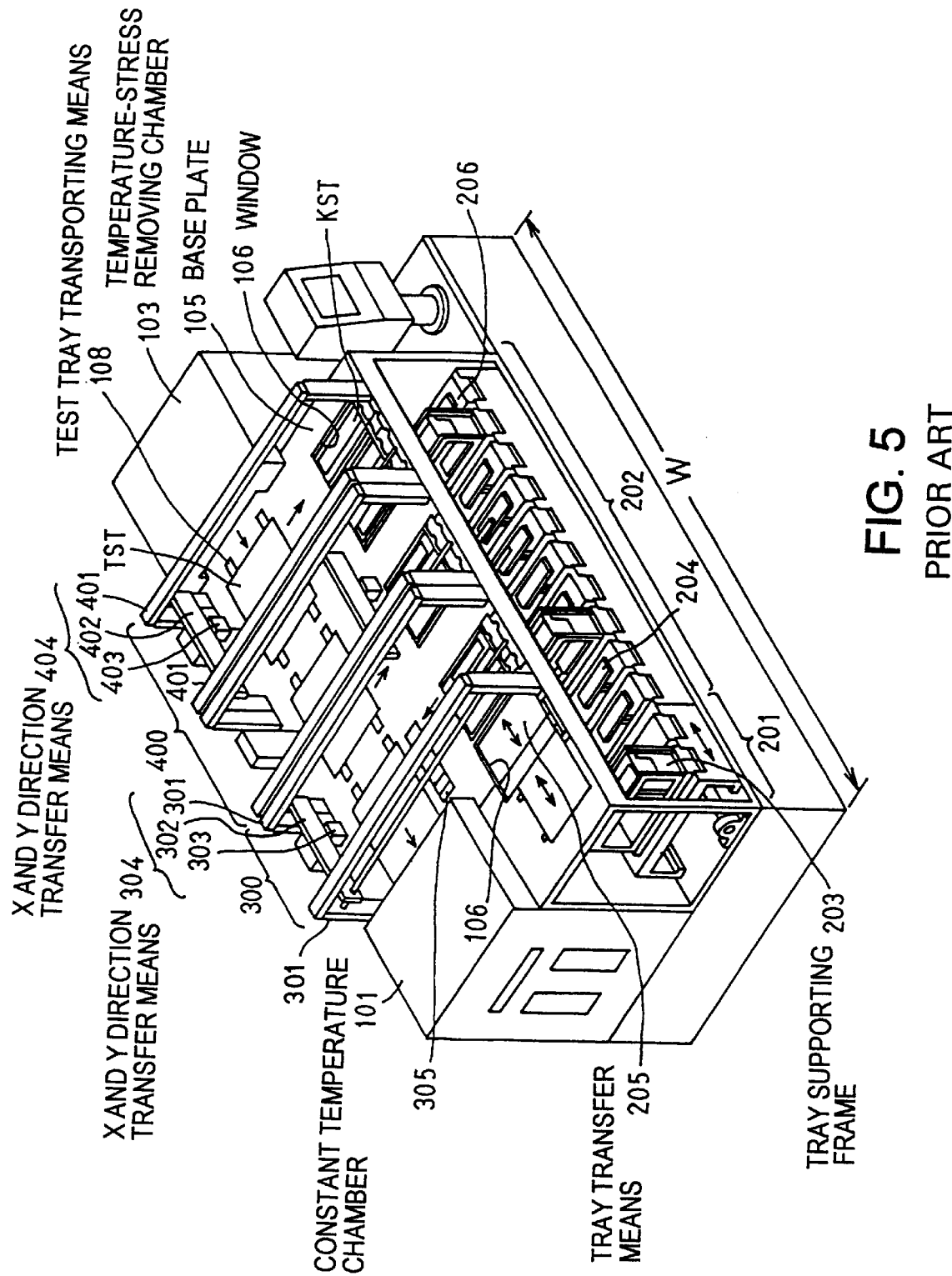
FIG. 5 is a schematic perspective view of the conventional IC testing apparatus shown in FIG. 4.
Figure 6:
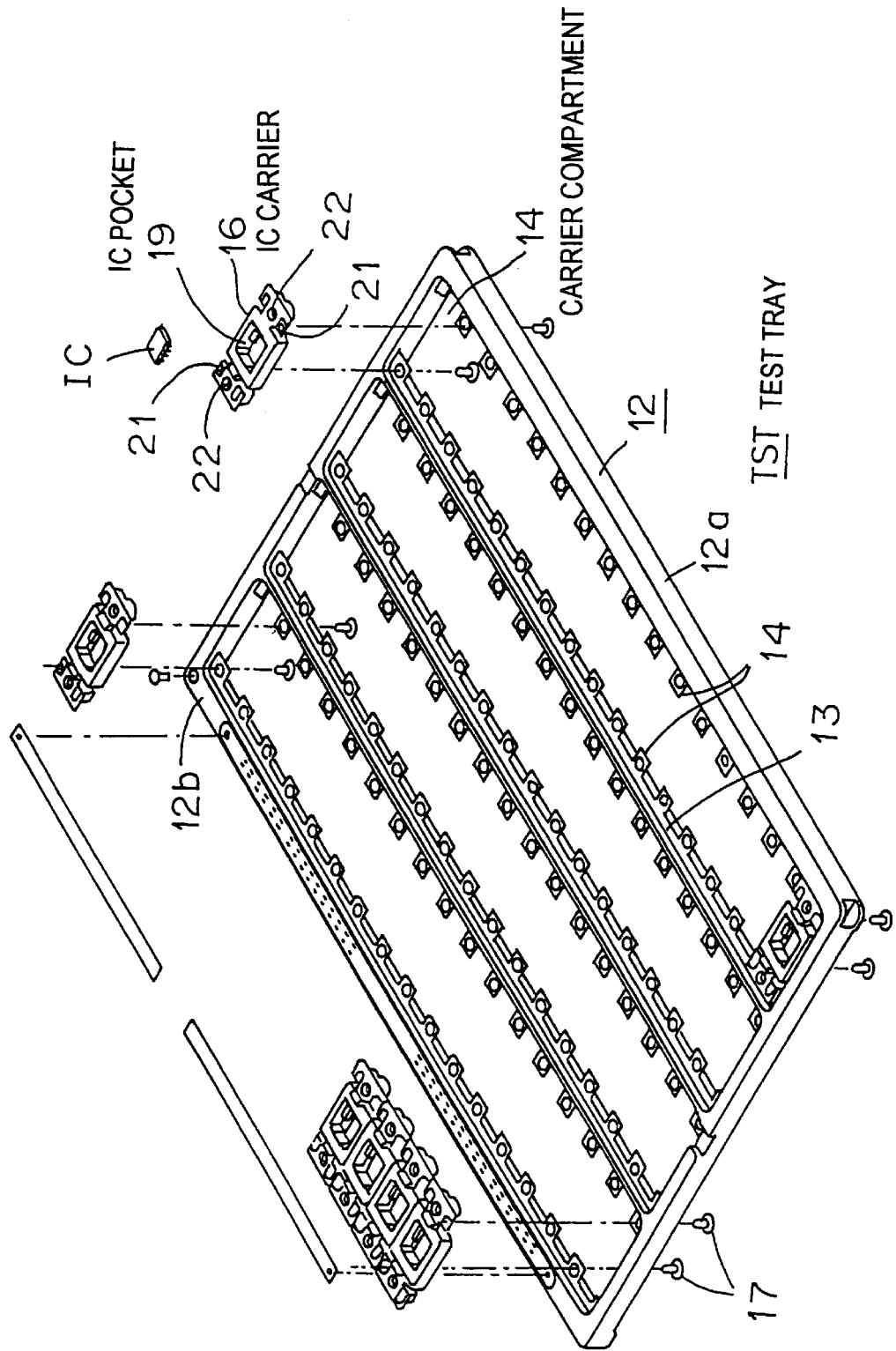
FIG. 6 is an exploded perspective view illustrating the construction of an example of the test tray for use with the IC testing apparatus.
Figure 7:
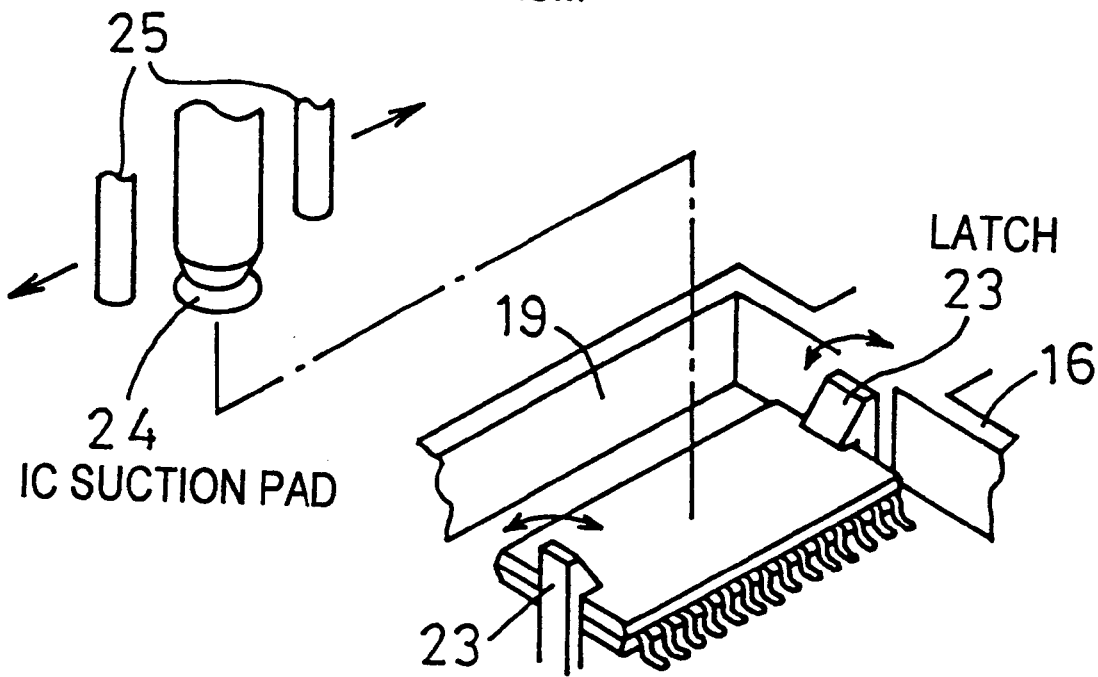
FIG. 7 is a schematic perspective view illustrating how an IC is stored in the test tray shown in FIG. 6.
Figure 8:
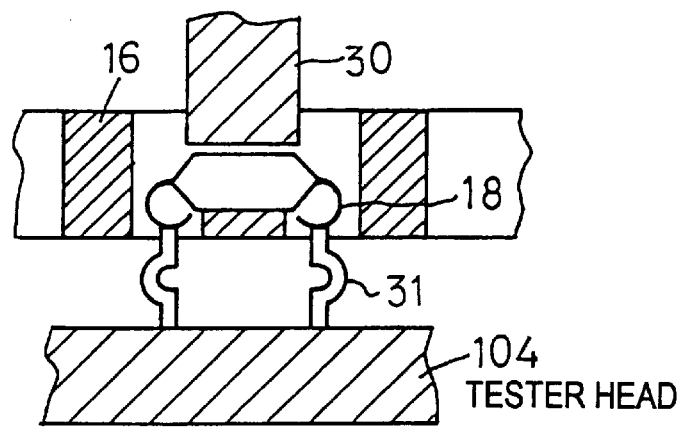
FIG. 8 is an enlarged cross-sectional view illustrating the manner in which the IC under test stored in the test tray shown in FIG. 6 is in electrical contact with the tester head.

FIG. 1 shows a first embodiment of the IC testing apparatus according to the present invention. The elements or parts shown in FIG. 1 corresponding to those of FIG. 4 are designated by the same reference numerals and will not be discussed again in detail, unless required. As with the conventional example shown in FIG. 4, the IC testing apparatus of the present invention comprises a chamber section 100, an IC storage section 200 for storing ICs to be tested and ICs already tested and sorted, a loader section 300 where ICs to be tested which a user has beforehand loaded on general-purpose trays KST are transferred and reloaded onto a test tray TST capable of withstanding high/low temperatures, and an unloader section 400 where the tested ICs which have been carried on the test tray TST out of the chamber section 100 subsequently to undergoing a test therein are transferred from the test tray TST to the general-purpose trays KST to be reloaded on the latter. The chamber section 100 comprises a constant temperature chamber 101 for imposing temperature stresses of either a designed high or low temperature on ICs to be tested loaded on a test tray TST, a test chamber 102 for conducting electrical tests on the ICs under the thermal stress imposed in the constant temperature chamber 101, and a temperature-stress removing chamber 103 for removing the temperature stress imposed in the constant temperature chamber 101 from the ICs having undergone the tests in the test chamber 102. The test chamber 102 contains therein the tester head 104 of the IC testing apparatus, the tester head 104 serving to apply various testing electric signals to the ICs under test electrically contacted therewith and receive response signals from the ICs and transmit same to the IC testing apparatus.

Figure 9:
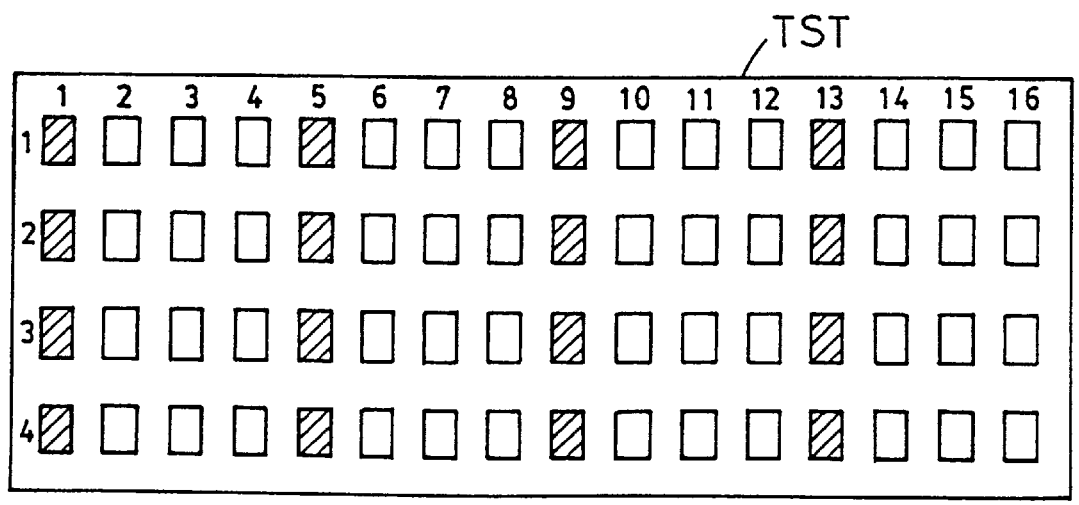
FIG. 9 is a plan view illustrating the order in which the ICs under test stored in the test tray are subjected to testing.
Figure 10:
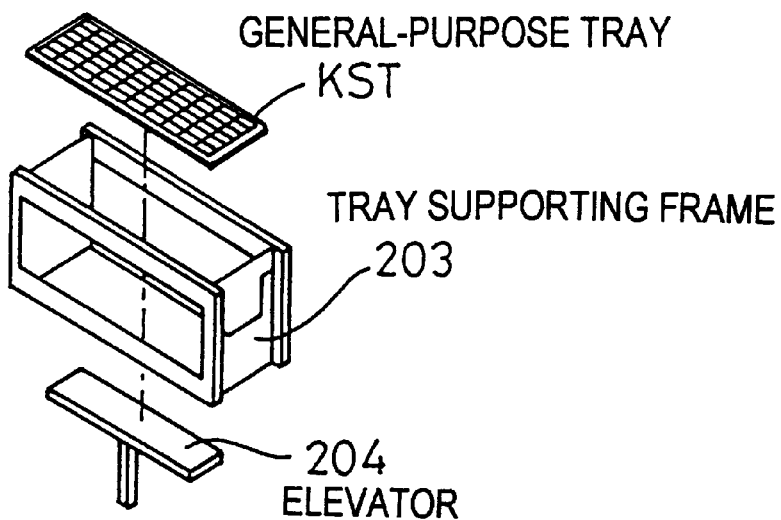
FIG. 10 is an exploded perspective view illustrating the construction of an IC storage rack or a tested IC storage rack for use with the IC testing apparatus.
Figure 11:
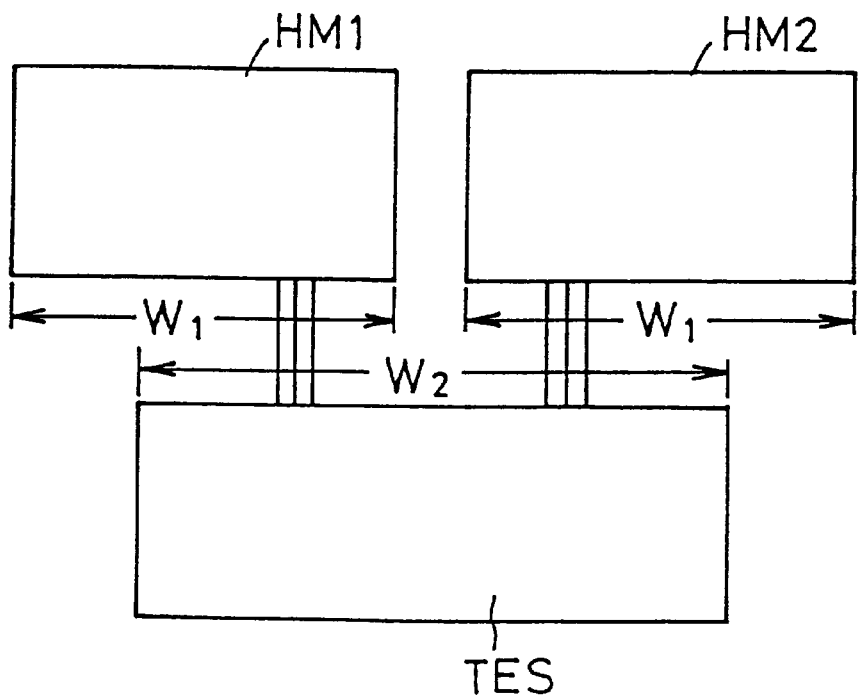
FIG. 11 is a schematic plan view for explaining the manner in which the IC testing apparatus is operated or run.

The present invention is characterized by the arrangement (construction) wherein the loader section 300 and the unloader section 400 are located this side or in front of the test chamber 102. More specifically, as will be appreciated from FIG. 1, the loader section 300 is located in front of the constant temperature chamber 101 and the unloader section 400 is located in front of the test chamber 102 and the temperature-stress removing chamber 103. Consequently, in the case where four test runs are to be conducted to complete the testing of all of the ICs to be tested placed on one test tray TST as discussed hereinabove with reference to FIG. 9, the test chamber 102 is only required to have a length (transverse of the testing apparatus) equal to the length of one test tray TST plus the distance through which the test tray TST is moved by four rows of ICs, as measured in the direction of travel of the test tray.

In the first embodiment of the present invention shown in FIG. 1, a test tray TST having ICs to be tested loaded thereon in the loader section 300 is conveyed into the constant temperature chamber 101 through an inlet formed in the front side thereof. In the constant temperature chamber 101 the test tray TST is moved downward by the vertical transport means and then delivered into the test chamber 102 which is connected with the lower portion of the constant temperature chamber 101 in transversely adjacent relation. It is to be appreciated that the test chamber 102 is connected with the constant temperature chamber 101 on the side face orthogonally intersecting with the side face in which the tray inlet into the constant temperature chamber is formed, so that the test tray TST is delivered out of the constant temperature chamber 101 in a direction perpendicular to the direction in which it has been introduced into the constant temperature chamber 101.

The test chamber 102 is maintained at the same temperature as in the constant temperature chamber 101, and is adapted to test ICs placed on the test tray TST through the tester head contained therein. Upon completion of the test on all of the ICs, the test tray TST is conveyed from the test chamber 102 to the temperature-stress removing chamber 103 where the tested ICs are relieved of the temperature-stress as the test tray is moved vertically by the associated vertical transport means. The test tray is then delivered from the temperature-stress removing chamber 103 to the unloader section 400 in a direction perpendicular to the direction in which it has been introduced from the test chamber 102 until it is stopped at a first position A in the unloader section.

In this first embodiment, the unloader section 400 is configured to allow for stopping a test tray TST at two positions A and B. Spanning the first and second positions A and B is a common X and Y direction transfer means 404 which operates to sort and pick up tested ICs from the test tray TST stopped at the first and second positions A and B on the basis of the test results and carry them to the general-purpose trays $KST_1$–$KST_4$ for the corresponding categories for storage therein.

The sorting operation will now be described. In the first embodiment, the sorting operation is performed with respect to only general-purpose trays arranged adjacent to each of the first and second positions A and B. Specifically, arranged at the first position A are general-purpose trays $KST_1$ and $KST_2$. Let it be asssumed that classification categories 1 and 2 are assigned to the general-purpose trays $KST_1$ and $KST_2$, respectively, while the test tray TST is stopped at the first position A, only the tested ICs belonging to the categories 1 and 2 are picked up from the test tray and transferred onto the corresponding general-purpose trays $KST_1$ and $KST_2$, respectively. Once the test tray TST stopping at the first position A has been depleted of the ICs belonging to the categories 1 and 2, the test tray is moved to the second position B.

Arranged at and in opposing relation to the second position B are general-purpose trays $KST_3$ and $KST_4$. Assuming that classification categories 3 and 4 are allotted to these general-purpose trays $KST_3$ and $KST_4$, respectively, the tested ICs belonging to the categories 3 and 4 are picked up from the test tray TST held at the second position B, and transferred onto the corresponding general-purpose trays $KST_3$ and $KST_4$, respectively. While the sorting is carried out at the second position B, the next test tray TST is delivered from the temperature-stress removing chamber 103 to the unloader section 400 and is stopped at the first position A in preparation for the sorting operation.

Although in the first embodiment the arrangement is such that the X and Y direction transfer means 404 is shared by the two unloader sections (represented by the first and second positions A and B), it is still possible to reduce the distance for the X and Y direction transfer means 404 required to travel for the sorting operation owing to the sorting operations being limited to the general-purpose trays $KST_1$, $KST_2$ and general-purpose trays $KST_3$, $KST_4$ adjacent to the test tray stop positions A and B, respectively. It is thus to be understood that this construction provides the advantage that the overall processing time required for the sorting may be shortened, despite the fact that the single X and Y direction transfer means 404 is used for the sorting operation.

It should be noted here that the number of general-purpose trays KST that can be installed in the unloader section 400 is limited to four by the space available in the first embodiment. Hence, the number of categories into which ICs can be sorted in real time operation is limited to four as discussed above. While four categories would generally be sufficient to cover three categories for subclassifying "pass articles" into high, medium and low response speed elements in addition to one category allotted to "failure article", in some instances there may be some among the tested ICs which do not belong to any of these categories. Should there be found any tested ICs which should be classified into a category other than the four categories, a general-purpose tray KST assigned to the additional category should be taken from the IC storage section 200 and be transported into the unloader section 400 to store the ICs of the additional category. In such case, it would be needed to transport any one of the general-purpose trays positioned in the unloader section 400 to the IC storage section 200 for storage therein.

If the replacement of the general-purpose trays is effected in the course of the sorting operation, the latter operation would have to be interrupted. For this reason, in the first embodiment a buffer section 405 is disposed between the stop positions A and B for the test tray TST and the locations of the general-purpose trays $KST_1$–$KST_4$. The buffer section 405 is configured to temporarily keep therein the tested ICs belonging to a category of rare occurrence.

The buffer section 405 may have a capacity of accommodating, say about twenty to thirty ICs and be equipped with a memory portion for storing the category of ICs placed in IC pockets of the buffer section 405. The locations and category of the individual ICs temporarily kept in the buffer section 405 are thus stored in the memory portion. Between the sorting operations or upon the buffer section 405 being filled with ICs, a general-purpose tray for the category to which the ICs kept in the buffer section 405 is carried from the IC storage section 200 to the unloader section 400 to receive the ICs. It should be noted that ICs temporarily kept in the buffer section 405 may be scattered over a plurality of categories. In that case, it would be required to transport so many general-purpose trays as the number of categories at a time from the IC storage section 200 to the unloader section 400.

Figure 2:
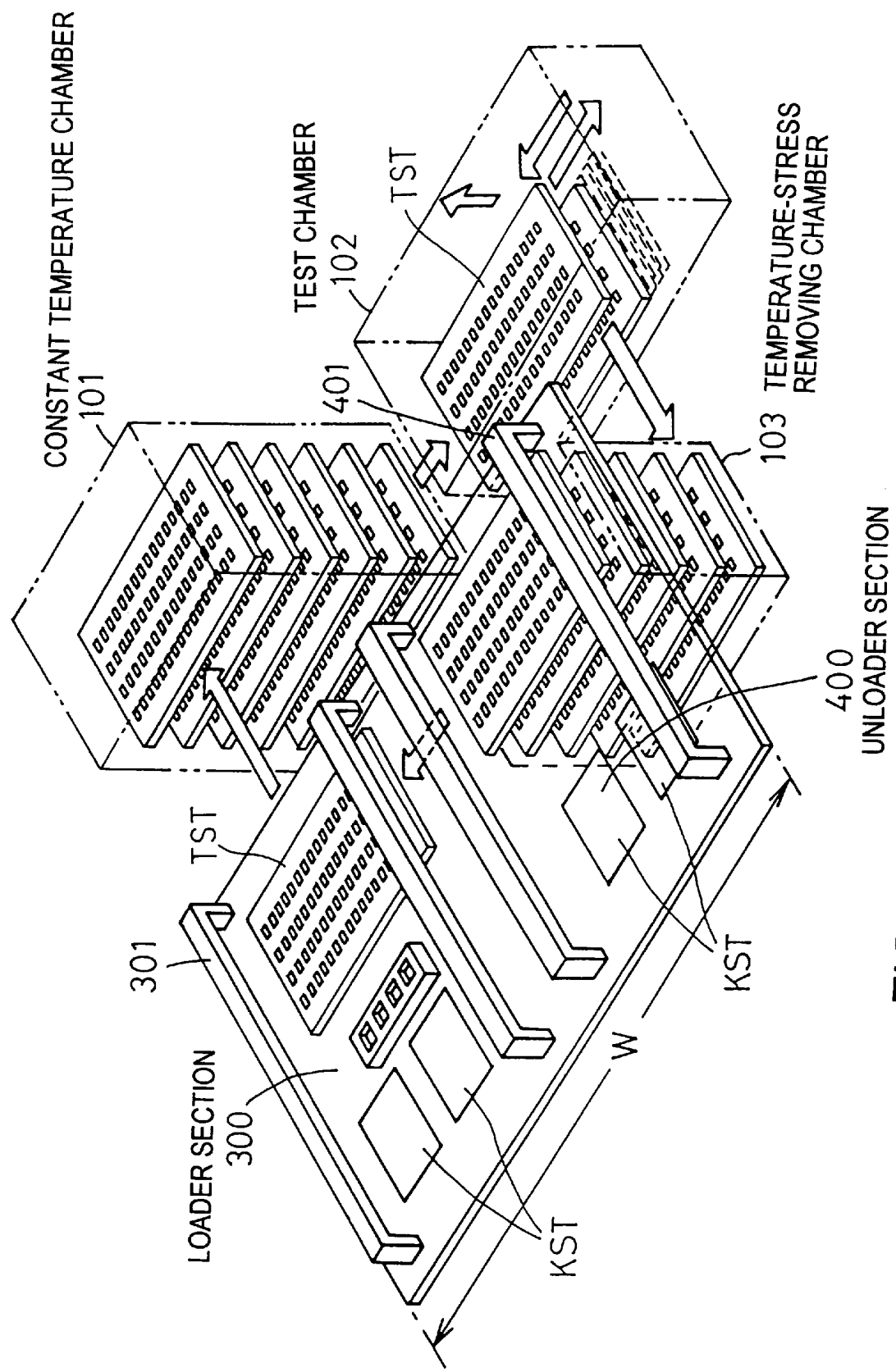
FIG. 2 is a perspective view schematically illustrating a second embodiment of the IC testing apparatus according to the present invention.

FIG. 2 shows a second embodiment of the IC testing apparatus according to the present invention. This second embodiment is characterized by the loader section 300 being located this side or in front of the constant temperature chamber 101, the test chamber 102 being connected with the lower portion of the constant temperature chamber 101 in transversely adjacent relation, and the unloader section 400 being located in overlying relation to the temperature-stress removing chamber 103. In FIG. 2, the arms and the other associated components of the X and Y direction transfer means mounted in the loader section 300 and the unloader section 400 are omitted for clarity of illustration.

According to the second embodiment shown in FIG. 2, the transverse width W of the handler portion may be reduced to about two test tray lengths. In addition, in this second embodiment, the arrangement is such that upon completion of the test in the test chamber 102, the test tray TST is lifted by one tier from the elevation at which it has been passed into the test chamber prior to being delivered out to the temperature-stress removing chamber 103. It is to be understood that varying the elevations at which the test tray is introduced into and delivered from the test chamber 102 makes it possible to effectuate simultaneously the introduction of one test tray and the delivery of another one test tray into and from the test chamber 102, resulting in reducing the time required to replace the test trays.

Figure 3A:
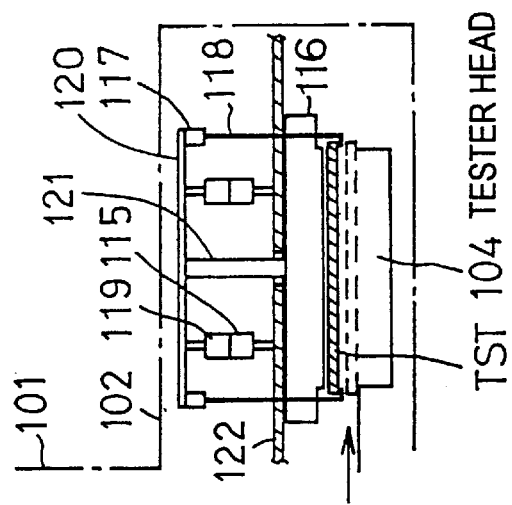
FIGS. 3A, 3B, and 3C are side views for explaining the operation of a portion of the IC testing apparatus shown in FIG. 2.
Figure 3B:
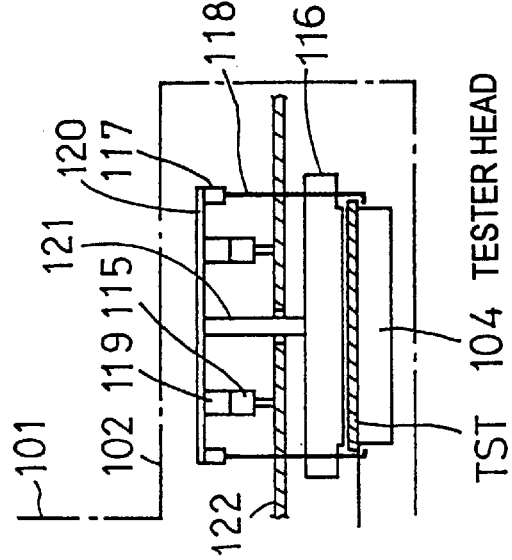
Figure 3C:
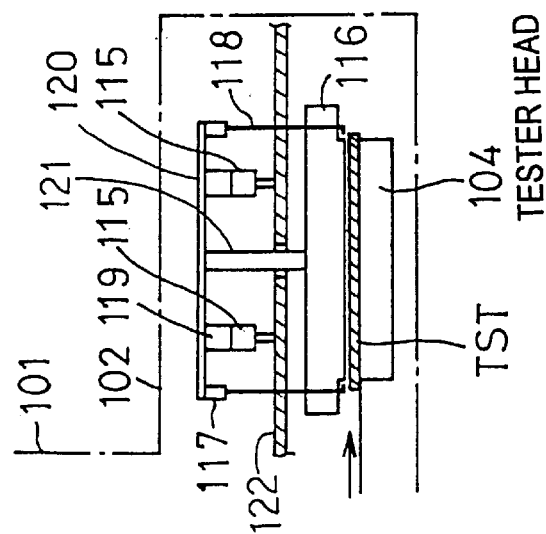

FIGS. 3A, 3B, and 3C illustrate the operation of replacing test trays TST in the test chamber 102. As shown, overlying the tester head 104 in the test chamber 102 is a pressure means 116 which is connected to a vertically movable plate 120 by means of a support rod 121. The support rod 121 extends to pass through a fixed plate 122 disposed between the movable plate 120 and the pressure means 116. The movable plate 120 and the fixed plate 122 are connected together by means of two dual cylinder assemblies, each comprising a first cylinder assembly 115 and a second cylinder assembly 119 which are operable independently of each other to extend and retract their own piston rods. The movable plate 120 has at its both ends a pair of third cylinder assemblies 117 depending therefrom to which hooks 118 are connected.

Specifically, FIG. 3A shows the status that the test tray TST has just been introduced into the test chamber 102 or that the test has been completed. The second cylinder assemblies 119 of the dual cylinder assemblies have their piston rods retracted whereby the movable plate 120 is correspondingly lowered. In this position a gap greater than the thickness of one test tray TST is defined between the tester head 104 and the pressure means 116. Upon a test tray TST being introduced into the test chamber 102 and aligned with the IC sockets of the tester head 104, it is stopped in place whereupon the first cylinder assemblies 115 are actuated to retract their piston rods, whereby the pressure means 116 is pressed against the test tray TST to urge the latter against the tester head 104. This brings the ICs under test loaded on the test tray TST into good contact with the IC sockets of the tester head 104 to establish electrical contact between the ICs and the IC tester portion to thereby ensure that required electrical testing is effected.

Upon the testing being terminated, the first cylinder assemblies 115 are actuated to extend their piston rods, whereby the pressure means 116 is raised to the position shown in FIG. 3A. Then, the third cylinder assemblies 117 are energized to extend their rods 118 downwardly as shown in FIG. 3B to engage the hooks mounted to the lower ends of the rods 118 with the test tray TST, whereupon the second cylinder assemblies 119 of the dual cylinder assemblies are actuated to extend their piston rods. This causes the pressure means 116 and the test tray TST to be raised as shown in FIG. 3C so as to provide a gap greater than the thickness of one test tray TST.

Once the test tray TST has been raised, the next test tray TST is transported into the position shown in FIG. 3A. The hooks at the lower ends of the rods 118 also serve as rail means, so that the test tray TST raised to the position shown in FIG. 3C may be delivered along the rails provided by the hooks out of the test chamber 102 towards the front into the temperature-stress removing chamber 103.

It should be reminded here that in testing ICs loaded on the test tray TST by bringing them into electrical contact with the tester head 104, the testing need be conducted in several runs for the reason as discussed before. In this second embodiment in which after the testing, the test tray TST is lifted prior to being passed into the temperature-stress removing chamber 103, the arrangement is such that when the test tray TST is introduced into the test chamber 102, it is initially carried to the deepest position in the chamber and thereafter indexed backward incrementally by one IC row each time until all of the test runs are completed as described above. The test chamber has the tray inlet and outlet provided in its side faces perpendicular to each other. Consequently, if the testing were designed to be carried out as the test tray was incrementally indexed forward, it would be necessary to dispose the tray outlet perpendicularly with respect to the terminal end of the test chamber 102. Since a space of transverse dimension is required to provide such tray outlet, disposing the tray outlet perpendicularly with respect to the terminal end of the test chamber 102 would need an increased transverse width. This is the reason why in the second embodiment the test tray TST is initially carried to the deepest position in the test chamber 102, followed by being incrementally indexed backward by one IC row each time.

As discussed hereinabove, according to the IC testing apparatus of the first embodiment, the transverse width W of the handler portion may be limited to the total transverse width of the constant temperature chamber 101, the test chamber 102 and the temperature-stress removing chamber 103. It can thus be appreciated that the transverse width of the handler portion may be reduced to about three times the longitudinal dimension of one test tray TST. As compared with the conventional handler portion having as large a transverse width as about five test tray lengths, it is possible to reduce the transverse width of the handler portion by as much as about two test tray lengths. Even as compared with the conventional testing apparatus having only one unloader section incorporated therein, reduction in the transverse width of the handler portion by one test tray length is possible, as stated hereinbefore. Consequently, even if two handler portions are incorporated for one IC tester portion, an IC testing apparatus with a reduced transverse width may be obtained.

According to the IC testing apparatus of the second embodiment, it is possible to reduce the transverse width W of the handler portion to about two test tray lengths, since it is only the constant temperature chamber 101 and the test chamber 102 that are arranged transversely of the IC testing apparatus (although the loader section 300 and the unloader section 400 are also transversely arranged, they are located either in front of or in the rear of the constant temperature chamber 101 and the test chamber 102). As a result, an IC testing apparatus with a further reduced transverse width may be provided.

In addition, with the testing apparatus according to the present invention, it is possible to adopt the arrangement in which a common X and Y direction transfer means 404 is disposed with respect to an unloader section 400 having two stop positions A and B for a test tray, enabling the reduction by one of the number of X and Y direction transfer means required and hence leading to reduction of cost. Moreover, in sorting out ICs from the test tray TST held still at the first and second stop positions A and B, it is so arranged that the sorting operation is carried out with respect to only general-purpose trays arranged adjacent to the respective stop positions A and B, which provides the advantage of shortening the time required for the sorting operation.

Further, according to the IC testing apparatus of the present invention, the buffer section 405 disposed between the unloader section 400 and the adjacent general-purpose trays provides means for temporarily keeping any tested ICs that may happen to belong to a classification category or categories other than particular, say four categories allocated to the general-purpose trays $KST_1$–$KST_4$. This allows for continuing the sorting operation while any one or more of the allocated general-purpose trays is replaced with a new general-purpose tray for the other category or categories taken from the IC storage section 200. Consequently, even in this case, the sorting operation may be carried out in a short time.

While ICs are illustrated as a semiconductor device in the foregoing description, it is needless to say that the present invention is also applicable to a testing apparatus for testing semiconductor devices other than ICs with equal functional effects.

What is claimed is:

1. A semiconductor device testing apparatus comprising:
   a loader section,
   a constant temperature chamber located directly adjacent said loader section,
   a test chamber located directly adjacent said constant temperature chamber, said test chamber containing a tester head disposed therein,
   a temperature-stress removing chamber located directly adjacent said tester- chamber, and
   two unloader sections, wherein
   a plurality of semiconductor devices to be tested are loaded onto a test tray transported into said loader section,
   said test tray loaded with said semiconductor devices is transported into said constant temperature chamber where a temperature stress of a desired temperature is imposed on said semiconductor devices,
   said test tray is then moved into said test chamber where the semiconductor devices carried on said test tray are brought into electrical contact with said tester head to test them for their electrical characteristics with the test results being stored for each of said semiconductor devices,
   upon completion of the testing said test tray is moved into said temperature-stress removing chamber where the tested semiconductor devices are relieved of the temperature stress of either a high or low temperature imposed in said constant temperature chamber,
   said test tray loaded with said temperature stress-relieved tested semiconductor device is delivered out to said two unloader sections where the tested semiconductor devices on said test tray are sorted out into pass articles and failure articles on the basis of said stored test results, followed by said pass and failure articles being transferred onto corresponding general-purpose trays,
   said constant temperature chamber, said test chamber and said temperature-stress removing chamber are disposed in a transverse direction of the apparatus in a side-by-side relation to form a transverse row therewith;
   said loader section is located in front of said constant temperature chamber in a front view of the apparatus in such a manner that a direction of supply of the test tray from the loader section to the constant temperature is at an angle of 90° to said transverse row in a plane view of the apparatus; and
   said two unloader sections are located in front of said test chamber and said temperature-stress removing chamber in a front view of the apparatus, respectively, in such a manner that a direction of supply of the test tray from the temperature-stress removing chamber to one of the two unloader sections is at an angle of 90° with respect to said transverse row, in the plane view of the apparatus.

2. The semiconductor device testing apparatus according to claim 1, wherein
   each of said constant temperature chamber and said temperature-stress removing chamber has a test tray inlet and a test tray outlet formed therein in perpendicular relation to each other;
   each of said constant temperature chamber and said temperature-stress removing chamber contains therein a vertical transport means for transporting the test tray in a vertical direction while maintaining it in a horizontal attitude; and
   said loader section and said unloader section are disposed in substantially the same plane.

3. The semiconductor device testing apparatus according to claim 1, wherein a common X and Y direction transfer means spanning said two unloader sections is provided, said common X and Y direction transfer means sorting out and picking up the tested semiconductor devices from both of the test trays as delivered out to said two unloader sections respectively on the basis of said test results and to transfer the semiconductor devices onto corresponding general-purpose trays.

4. The semiconductor device testing apparatus according to claim 3, further comprising a buffer section disposed between the test tray stopped at one of said unloader sections and general-purpose trays disposed adjacent to said unloader sections for storing the tested semiconductor devices therein, said buffer section being adapted to temporarily keep tested semiconductor devices.

5. The semiconductor device testing apparatus according to claim 1, wherein
   the unloader section located in front of said test chamber is a first unloader section while the unloader section located in front of said temperature-stress removing chamber is a second unloader section;
   general-purpose of different categories trays are disposed adjacent to said first and second unloader sections, respectively;
   wherein in said first unloader section only the tested semiconductor devices belonging to categories allotted to said general-purpose trays adjacent to said first unloader section are taken from the test trays as delivered out to said first unloader section and then transferred onto the corresponding general-purpose trays and thereafter said test tray is passed to said second unloader section; and in said second unloader section only those of the tested semiconductor devices belonging to categories allotted to said general-purpose trays adjacent to said second unloader section are taken from the test tray as passed to said second unloader section and then transferred onto the corresponding general-purpose trays.

6. A semiconductor testing apparatus designed to have less transverse width in a transverse direction of the apparatus than that of earlier such testing apparatuses, said testing apparatus comprising:

two unloader sections;

a constant temperature chamber;

a test chamber;

a temperature-stress removing chamber; and a loader section; wherein said constant temperature chamber, said test chamber and said temperature-stress removing chamber are disposed in the transverse direction of said apparatus in a side-by-side relation, with no elements being placed therebetween;

said loader section is disposed in front of the constant temperature chamber in a front view of the apparatus in such a manner that a direction of supply of the test tray from the loader section to the constant temperature chamber is at an angle of 90° to said transverse direction of the apparatus in a plane view of the apparatus; and said two unloader sections are disposed in front of said test chamber and said temperature-stress removing chamber, in a front view of the apparatus, respectively, in such a manner that a direction of supply of the test tray from the temperature-stress removing chamber to one of the two unloader sections is at an angle of 90° to said transverse direction, in the plane view of the apparatus.

7. A semiconductor device testing apparatus comprising:

a loader section;

a constant temperature chamber of a vertically elongated shape having a test tray inlet formed in a front face thereof at an uppermost extent of the constant temperature chamber and a test tray outlet formed in a side face thereof at a lowermost extent of the constant temperature chamber in a perpendicular relation to the inlet thereof;

a test chamber having a test tray inlet and a test tray outlet;

a temperature-stress removing chamber of a vertically elongated shape having a test tray inlet formed in a side face thereof at a lowermost extent of the temperature-stress removing chamber and a test tray outlet formed in a front face thereof at an uppermost extent of the temperature-stress removing chamber in perpendicular relation to the inlet thereof; and unloader means having a test tray inlet formed in a back side thereof and a test tray outlet formed in a perpendicular relation to the inlet thereof; wherein said loader section is disposed in front of said constant temperature chamber in a front view of the apparatus in such a manner that the test tray outlet of the loader section and the test tray inlet of the constant temperature chamber are aligned in a line at an angle of 90° to a transverse direction, whereby a test tray loaded with semiconductor devices to be tested is derived out of the test tray outlet of the loader section and transported into the test tray inlet of the constant temperature chamber along the line, said constant temperature chamber, said test chamber and said temperature-stress removing chamber are disposed in a side-by-side relation to form a first row therewith in a transverse direction of the apparatus in such a manner that the test tray outlet of said constant temperature chamber and the test tray inlet of said test chamber are directly connected together, and the test tray outlet of said test chamber and the test tray inlet of said temperature-stress removing chamber are directly connected together, whereby the test tray loaded with the semiconductor devices is transported out of the constant temperature chamber through the test chamber where desired tests are performed on the semiconductor devices to the temperature-stress removing chamber along the first row, said unloader means is disposed in front of said temperature-stress removing chamber and said test chamber in the front view of the apparatus in such a manner that the test tray outlet of said temperature-stress removing chamber and the test tray inlet of said unloader means are aligned in another line which is at an angle of 90° with respect to the transverse direction of the apparatus, whereby the test tray loaded with the semiconductor devices thus tested is derived out of the temperature-stress removing chamber and transported into the unloader means, and said unloader means and said loader section are disposed in a side-by-side relation parallel to the transverse direction of the apparatus in such a manner that the test tray outlet of the unloader means and the test tray inlet of the loader section are connected together, to thereby form a second row therewith, which row is disposed in front of said first row when viewed from a front to a back side of the apparatus, whereby the tested semiconductor devices loaded on the test tray are transferred from the test tray to general-purpose trays of different categories in accordance with test results by said unloader means and a vacant test tray is transported back to the loader section.

8. The semiconductor device testing apparatus according to claim 7, wherein said unloader means has a first unloader section and a second unloader section disposed in a side-by-side relation together with the loader section to form the second row therewith, said first unloader section is located in front of said temperature-stress removing chamber in the front view of the apparatus and having a test tray inlet which is directly connected to the test tray outlet of the temperature-stress removing chamber, said second unloader section is disposed in front of said test chamber in the front view of the apparatus, and positions between the first unloader section and the loader section, whereby the test tray is transported back from the first unloader section through the second unloader section to the loader section.

9. The semiconductor device testing apparatus according to claim 7, wherein said constant temperature chamber has vertical transport means for transporting the test tray thus supplied into the test tray inlet thereof downward from the test tray inlet to the test tray outlet thereof, and said temperature-stress removing chamber has vertical transport means for transporting the test tray thus supplied in the test tray inlet thereof upward from the test tray inlet to the test tray outlet thereof, and the test tray outlet of said unloader means and the test tray inlet of said loader section are disposed in substantially the same plane vertically higher than that of the first row.

10. A semiconductor device testing apparatus comprising:

a loader section loading a plurality of semiconductor devices to be tested onto a test tray;

a constant temperature chamber having a vertical test tray path for applying a desired temperature-stress to the semiconductor devices carried therethrough by a test tray, a test tray inlet formed at an uppermost extent of the vertical path, and a test tray outlet formed at a lowermost extent of the vertical path in a perpendicular relation to the test tray inlet;

a test chamber having a test tray inlet and a test tray outlet for performing desired tests on the semiconductor devices;

a temperature-stress removing chamber having a test tray inlet and a test tray outlet formed in a perpendicular relation to the test tray inlet thereof for removing the temperature-stress from the semiconductor devices thus tested; and unloader means having a test tray inlet and a test tray outlet formed in a perpendicular relation to the test tray inlet thereof for transferring the tested semiconductor devices from the test tray to general-purpose trays of different categories based on test results; wherein said constant temperature chamber, said test chamber and said temperature-stress removing chamber are disposed in a side-by-side relation in a transverse direction of the apparatus in such a manner that the test tray outlet of said constant temperature chamber and the test tray inlet of said test chamber are directly connected together, and the test tray outlet of said test chamber and the test tray inlet of said temperature-stress removing chamber are directly connected together, to thereby form a first row therewith, said loader section and said unloader means are disposed in a side-by-side relation in the transverse direction in such a manner that the test tray outlet of the unloader means and the test tray inlet of the loader section are connected together, to thereby form a second row therewith, which is disposed in front of said first row when viewed from a front to a back side of the apparatus, said loader section is disposed in front of said constant temperature chamber so that the test tray outlet of the loader section and the test tray inlet of the constant temperature chamber are aligned in a line perpendicular to said transverse direction and directly connected together, and said unloader means is disposed in front of said temperature-stress removing chamber and said test chamber in such a manner that the test tray outlet of said temperature-stress removing chamber and the test tray inlet of said unloader means are aligned in another line perpendicular to said transverse direction and directly connected together.

11. A semiconductor device testing apparatus comprising:

a plurality of test trays each carrying semiconductor devices to be tested;

a loader section loading semiconductor devices to be tested onto the test trays:

a constant temperature chamber receiving the test tray from the loader section and applying a desired temperature-stress to the semiconductor devices to be tested which are introduced therein by the test tray;

a test chamber receiving the test tray from the constant temperature chamber and applying desired tests to the semiconductor devices to be tested which are introduced therein by the test tray;

a temperature-stress removing chamber receiving the test tray from the constant temperature chamber, and removing the temperature-stress from the tested semiconductor devices which are introduced therein by the test tray;

a first unloader section receiving the test tray from the temperature-stress removing chamber and unloading the tested semiconductor devices which are introduced therein by the test tray into general-purpose trays of first classified categories in accordance with test results; and a second unloader sections receiving the test tray from the first unloader section, and unloading any of the semiconductor devices remained on the test tray introduced therein into general-purpose trays of second classified categories in accordance with test results to thereby obtain the test tray in vacant state, which is supplied to the loader section; wherein said constant temperature chamber, said test chamber and said temperature-stress removing chamber are arranged in a side-by-side relation in a transverse direction of the apparatus to form a first transverse row therewith, said loader section and said first and second unloader sections are arranged in a side-by-side relation in the transverse direction of the apparatus to form a second transverse row therewith, and said first and second transverse rows are disposed in parallel to each other in a plane view of the apparatus in such a manner that the loader section is located in front of said constant temperature chamber, that the first unloader section is located in front of the temperature-stress removing chamber, and that the second unloader section is located in front of the test chamber, respectively, in a front view of the apparatus.

12. A semiconductor device testing apparatus according to claim 11 wherein:

each of the constant temperature chamber and the temperature-stress removing chamber includes vertical tray transport means for transporting the test trays in a vertical direction while maintaining the horizontal attitude thereof, and the loader section and the unloader section are arranged substantially in the same plane.

13. A semiconductor device testing apparatus according to claim 11, further comprising common transport means, which spans across the two unloader sections, for sorting and picking-up of the tested semiconductor devices from the two test trays respectively transported to the two unloader sections, on the basis of the test results, and for transporting in a horizontal plane the semiconductor devices on to corresponding general-purpose trays.

14. A semiconductor device testing apparatus according to claim 13, wherein a buffer section is arranged between the test tray stopped at both two unloader sections and the general-purpose trays installed in the unloader section, and temporarily holds the tested semiconductor devices which are to be thereafter picked up and transferred to general-purpose trays of corresponding categories.

15. A semiconductor device testing apparatus according to claim 11, wherein:

general-purpose trays are respectively arranged adjacent to the first and second unloader sections respectively, and in the first unloader section only those tested semiconductor devices which belong to categories which are associated with the general-purpose trays arranged adjacent to the first unloader section are picked up from the test tray transported to the first unloader section and then transported on to the corresponding, general-purpose trays, and then the test tray is further moved to the second unloader section in which only those tested semiconductor devices which belong to categories which are associated with the general purpose trays arranged adjacent to the second unloader section are picked up from the test tray transported to the second unloader section, and then transported transferred on to the corresponding, general-purpose trays.

16. A semiconductor device testing apparatus according to claim 15, wherein a buffer section is arranged between the test tray stopped at both two unloader sections and the general-purpose trays installed in the unloader section, and temporarily holds the tested semiconductor devices which are to be thereafter picked up and transferred to general-purpose trays of corresponding categories.

17. A semiconductor device testing apparatus comprising:

a plurality of test trays each carrying semiconductor devices to be tested;

a loader section having a test tray inlet for receiving a vacant test tray, loading semiconductor devices to be tested onto the vacant test tray, and having a test tray outlet for deriving the test tray loaded with semiconductor devices to be tested, a direction of introduction of the test tray and a direction of derivation of the test tray being different at a right angle to each other in a plane view;

a constant temperature chamber having a test tray inlet connected to the test tray outlet of the loader section and a test tray outlet formed in different chamber sides thereof which extend at a right angle to each other in a plane view of the apparatus, and imposing a desired temperature-stress on the semiconductor devices to be tested which are introduced therein by the test tray;

a test chamber having a test tray inlet connected to the test tray outlet of the constant temperature chamber and a test tray outlet formed opposite to the test tray inlet thereof, and applying desired testing on the semiconductor devices to be tested which are introduced therein by the test tray;

a temperature-stress removing chamber having a test tray inlet connected to the test tray outlet of the test chamber and a test tray outlet formed in different chamber sides thereof which extend at a right angle to each other in the plane view, and removing the temperature-stress from the tested semiconductor devices introduced by the test tray;

a first unloader section having a test tray inlet connected to the test tray outlet of the temperature-stress removing chamber for receiving the test tray with the tested semiconductor devices, unloading the tested semiconductor devices into general-purpose trays of first classified categories in accordance with test results, and having a test tray outlet for outputting the test tray loaded with the semiconductor devices which are remained due to out of the first classified categories, a direction of introduction of the test tray therein and a direction of derivation of the test tray therefrom being at a right angle to each other in a plane view; and a second unloader sections having a test tray inlet connected to the test tray outlet of the first unloader, unloading all the remained semiconductor devices into general-purpose trays of second classified categories in accordance with test results to thereby become the test tray vacant, and having a test tray outlet formed opposite to the test tray inlet thereof and connected to the test tray inlet of the loader section for supplying therefrom the vacant test tray to the loader section; wherein said constant temperature chamber, said test chamber and said temperature-stress removing chamber are arranged in a side-by-side relation in a transverse direction of the apparatus to form a first transverse row therewith, said loader section and said first and second unloader sections are arranged in a side-by-side relation in the transverse direction of the apparatus to form a second transverse row therewith, said first and second transverse rows are disposed in parallel to each other in the transverse direction of the apparatus in a plane view of the apparatus in such a manner that the loader section is located in front of said constant temperature chamber, that the first unloader section is located in front of the temperature-stress removing chamber, and that the second unloader section is located in front of the test chamber, respectively, in a front view of the apparatus.

18. A semiconductor device testing apparatus designed to have a less transverse width in a transverse direction of the apparatus than that of earlier such testing apparatuses, said testing apparatus comprising:

a plurality of test trays each having a transverse width in a transverse direction of the apparatus and carrying semiconductor devices to be tested;

a loader section having a test tray inlet to which a vacant test tray is introduced, loading semiconductor devices to be tested onto the vacant test tray, and having a test tray outlet for deriving the test tray loaded with semiconductor devices to be tested, a direction of introduction of the test tray therein and a direction of derivation of the test tray therefrom being at a right angle to each other in a plane view of the apparatus;

a constant temperature chamber having a test tray inlet connected to the test tray outlet of the loader section and a test tray outlet formed in different chamber sides thereof which extend at a right angle to each other in the plane view, and imposing a desired temperature-stress on the semiconductor devices to be tested which are introduced therein by the test tray;

a test chamber having a test tray inlet connected to the test tray outlet of the constant temperature chamber and a test tray outlet formed opposite to the test tray inlet thereof, and applying desired testing on the semiconductor devices to be tested which are introduced therein by the test tray;

a temperature-stress removing chamber having a test tray inlet connected to the test tray outlet of the test chamber and a test tray outlet formed in different chamber sides thereof which extend at a right angle to each other in the plane view, and removing the temperature-stress from the tested semiconductor devices which are introduced therein by the test tray;

a first unloader section having a test tray inlet connected to the test tray outlet of the temperature-stress removing chamber, unloading the tested semiconductor devices into general-purpose trays of first classified categories in accordance with test results, and having a test tray outlet for outputting the test tray loaded with the semiconductor devices which are remained due to out of the first classified categories, a direction of introduction of the test tray therein and a direction of derivation of the test tray therefrom being at a right angle to each other in the plane view; and a second unloader section having a test tray inlet connected to the test tray outlet of the first unloader, unloading all the remained semiconductor devices into general-purpose trays of second classified categories in accordance with test results to thereby become the test tray vacant, and having a test tray outlet formed opposite to the test tray inlet thereof and connected to the test tray inlet of the loader section for supplying therefrom the vacant test tray to the loader section; wherein said constant temperature chamber, said test chamber and said temperature-stress removing chamber are arranged in a side-by-side relation in a transverse direction of the apparatus to form a first transverse row therewith, each of said constant temperature chamber, said test chamber and said temperatures tress removing chamber has a transverse width equal to or larger than that of the test tray, so that the first transverse row has a transverse width at least three times as large as that of the test tray, said loader section and said first and second unloader sections are arranged in a side-by-side relation in the transverse direction of the apparatus to form a second transverse row therewith, each of said loader section and said first and second unloader sections has a transverse width equal to or larger than that of the test tray, so that the second row has at least three times as large as the transverse width of the test tray, said first and second transverse rows are disposed in parallel to each other in the transverse direction of the apparatus in such a manner that the loader section is located in front of said constant temperature chamber, that the first unloader section is located in front of the temperature-stress removing chamber, and that the second unloader section is located in front of the test chamber, respectively, in a front view of the apparatus.

19. A semiconductor device testing apparatus comprising:

a plurality of test trays carrying semiconductor devices to be tested;

a loader section loading the semiconductor devices to be tested onto a vacant test tray supplied thereto;

a constant temperature chamber receiving the test tray thus loaded with the semiconductor devices from the loader section and applying a desired temperature-stress to the semiconductor devices;

a test chamber receiving the test tray from the constant temperature chamber and applying a desired test to the semiconductor devices;

a temperature-stress removing chamber receiving the test tray with the tested semiconductor devices from the test chamber, and removing the temperature-stress from the tested semiconductor devices;

a first unloader section receiving the test tray from the temperature-stress removing chamber, and transferring the tested semiconductor devices into general-purpose trays of different categories in a first classification according to test results; and a second unloader section receiving from the first unloader section the test tray loaded with the semiconductor devices which are remained due to in a second classification, and transferring all the semiconductor devices into general-purpose trays of different categories in the second classification according to the test results to thereby obtain the test tray caused to be vacant, which is supplied to the loader section in a cyclic use thereof; wherein each of said loader section, constant temperature chamber, test chamber, temperature-stress removing chamber, and first and second unloader section has a test tray inlet and a test tray outlet, respectively, said loader section is supplied with the vacant test tray at the test tray inlet thereof from the second unloader section, and derives the test tray loaded with the semiconductor devices to be tested out of the test tray outlet thereof, a direction of receipt of the test tray and a direction of derivation of the test tray being different at a right angle to each other in a plane view of the apparatus, said constant temperature chamber is supplied at the test tray inlet thereof with the test tray from the loader section, and derives the test tray out of the test tray outlet thereof, a direction of receipt of the test tray and a direction of derivation of the test tray being different at a right angle to each other in the plane view, said test chamber is supplied at the test tray inlet thereof with the test tray from the constant temperature chamber, and derives the test tray out of the test tray outlet thereof, a direction of receipt of the test tray and a direction of derivation of the test tray being aligned in a line parallel to the transverse direction of the apparatus in the plane view, said temperature-stress removing chamber is supplied at the test tray inlet thereof with the test tray from the test chamber, and derives the test tray out of the test tray outlet thereof, a direction of receipt of the test tray and a direction of derivation of the test tray being different at a right angle to each other in the plane view, said first unloader section is supplied at the test tray inlet thereof with the test tray from the temperature-stress removing chamber, and derives the test tray out of the test tray outlet thereof, a direction of receipt of the test tray and a direction of derivation of the test tray being different at a right angle to each other in the plane view, said second unloader section is supplied at the test tray inlet thereof with the test tray from the first unloader section, and derives the test tray out of the test tray outlet thereof, a direction of receipt of the test tray and a direction of derivation of the test tray being aligned in a line parallel to the transverse direction of the apparatus in the plane view, said constant temperature chamber, said test chamber and said temperature-stress removing chamber are arranged in a side-by-side relation in a transverse direction of the apparatus by connecting the test tray outlet of the constant temperature chamber to the test tray outlet of the test chamber and by connecting the test tray outlet of the test chamber to the test tray outlet of the temperature-stress removing chamber, to thereby form a first transverse row therewith, said loader section and said first and second unloader sections are arranged in a side-by-side relation in the transverse direction of the apparatus by connecting the test tray outlet of the first unloader section to the test tray inlet of the second unloader section, and by connecting the test tray outlet of the second unloader section to the test tray inlet of the loader section, to thereby form a second transverse row therewith, said first row and second row are arranged in parallel to each other in the transverse direction of the apparatus in the plane view, and said loader section is arranged in front of the constant temperature chamber and said first unloader section is arranged in front of the temperature-stress removing chamber, respectively, in the front view of the apparatus, so that the second unloader section is located in front of the test chamber.

20. A semiconductor device testing apparatus comprising:

a plurality of test trays each carrying semiconductor devices to be tested;

a loader section loading semiconductor devices to be tested onto the test-trays:

a constant temperature chamber applying a desired temperature-stress to the semiconductor devices to be tested;

a test chamber applying desired tests to the semiconductor devices to be tested;

a temperature-stress removing chamber removing the temperature-stress from the tested semiconductor devices; and a first and a second unloader section each unloading the tested semiconductor devices into general-purpose trays of different classified categories based on test results; wherein said loader section is disposed in front of the constant temperature chamber in a front view of the apparatus so that a test tray loaded with the semiconductor devices to be tested is introduced from the loader section into the constant temperature chamber along a direction perpendicular to the transverse direction of the apparatus in a plane view of the apparatus, whereby the desired temperature stress is applied to the semiconductor devices loaded on the test tray, said constant temperature chamber, said test chamber and said temperature-stress removing chamber are arranged in a side-by-side relation in the transverse direction of the apparatus to form a first transverse row therewith, whereby the test tray loaded with the semiconductor devices to which the desired temperature stress have been applied is transported, in the first transverse row from the constant temperature chamber into the test chamber, where the desired test is applied to the semiconductor devices, and the test tray loaded with the thus tested semiconductor devices is then transported in the first transverse row from the test chamber into the temperature-stress removing chamber, where the temperature-stress is removed from the tested semiconductor devices, said first unloader section is disposed in front of the temperature-stress removing chamber in a front view of the apparatus so that the test tray loaded with the tested semiconductor devices is introduced from the temperature-stress removing chamber into the first unloader section along a direction perpendicular to the transverse direction of the apparatus in the plane view of the apparatus, whereby the tested semiconductor devices are unloaded into general-purpose trays of different categories in a first classification based on test results, said first and second unloader sections and loader section are arranged in a side-by-side relation in the transverse direction of the apparatus to form a second transverse row therewith, whereby the test tray loaded with the tested semiconductor devices which are remained due to out of the first classification is transported in the second transverse row from the first unloader section into the second unloader section, where the remained semiconductor devices are unloaded into general-purpose trays of different categories in a second classification based on the test results, and the test tray thus emptied is then transported in the second transverse row from the second unloader section into the loader section, where the test tray is utilized in cyclic use thereof, and said second transverse row is disposed in parallel to the first transverse row in the plane view of the apparatus as well as in front of the first transverse row in the front view of the apparatus in such an manner that the loader section is located in front of said constant temperature chamber, that the first unloader section is located in front of the temperature-stress removing chamber, and that the second unloader section is located in front of the test chamber, respectively, in a front view of the apparatus.

21. The semiconductor testing apparatus according to claim 20, wherein each of said test trays has a transverse width in a transverse direction of the apparatus, each of said loader section, constant temperature chamber, test chamber, temperature-stress removing chamber and first and second unloader sections has a transverse width equal to or larger than that of the test tray, so that the apparatus has a transverse width which is at least three times as large as that of the test tray.

* * * * *

UNITED STATES PATENT AND TRADEMARK OFFICE
CERTIFICATE OF CORRECTION

PATENT NO. : 6,104,183
DATED : August 15, 2000
INVENTOR(S) : Kobayashi et al.

It is certified that error appears in the above-identified patent and that said Letters Patent is hereby corrected as shown below:

Title page,
The following category has been omitted
    -- FOREIGN PATENT DOCUMENTS
06-043212    02/18/94    Japan
05-060832    03/12/93    Japan
06-300816    10/28/94    Japan
06-174785    06/24/94    Japan Column 3,
Line 42, change "." to -- , --. *

Column 16,
Line 66, after "wherein" insert -- , --.

Signed and Sealed this

Fifth Day of March, 2002

Attest:

JAMES E. ROGAN
Attesting Officer    Director of the United States Patent and Trademark Office